(12) United States Patent
Inoue

(10) Patent No.: US 9,679,748 B2
(45) Date of Patent: Jun. 13, 2017

(54) MULTI CHARGED PARTICLE BEAM WRITING APPARATUS, AND MULTI CHARGED PARTICLE BEAM WRITING METHOD

(71) Applicant: NuFlare Technology, Inc., Yokohama-shi (JP)

(72) Inventor: Hideo Inoue, Miura-gun (JP)

(73) Assignee: NuFlare Technology, Inc., Yokohama-shi (JP)

( * ) Notice: Subject to any disclaimer, the term of this patent is extended or adjusted under 35 U.S.C. 154(b) by 0 days.

(21) Appl. No.: 15/072,894

(22) Filed: Mar. 17, 2016

(65) Prior Publication Data

US 2016/0284513 A1 Sep. 29, 2016

(30) Foreign Application Priority Data

Mar. 26, 2015 (JP) ................. 2015-064281

(51) Int. Cl.
*H01J 37/00* (2006.01)
*H01J 37/317* (2006.01)
*H01J 37/302* (2006.01)

(52) U.S. Cl.
CPC ...... *H01J 37/3177* (2013.01); *H01J 37/3026* (2013.01); *H01J 2237/31762* (2013.01); *H01J 2237/31764* (2013.01)

(58) Field of Classification Search
CPC .............. H01J 37/3177; H01J 37/3026; H01J 2237/31764; H01J 2237/31762
USPC ........................................... 250/492.1–492.3
See application file for complete search history.

(56) References Cited

U.S. PATENT DOCUMENTS

2014/0124684 A1* 5/2014 Matsumoto ......... H01J 37/3174
250/492.3
2014/0361193 A1 12/2014 Matsumoto

FOREIGN PATENT DOCUMENTS

JP 2014-112639 6/2014

OTHER PUBLICATIONS

Office Action issued Feb. 22, 2017 in Taiwanese Patent Application No. 105107203 (with English translation).

* cited by examiner

*Primary Examiner* — Michael Maskell
(74) *Attorney, Agent, or Firm* — Oblon, McClelland, Maier & Neustadt, L.L.P.

(57) ABSTRACT

A multi charged particle beam writing apparatus includes a dividing circuitry to divide first irradiation time data into k pieces of second irradiation time data, where each of the k pieces of second irradiation time data has a different number of bits and the total of different numbers of bits is n-bits, in multi-pass writing of k or more passes by using multi charged particle beams, a data transmission circuitry to transmit, for each of k passes, corresponding second irradiation time data, for a beam concerned in multi charged particle beams, a resolution information transmission circuitry to transmit, for each of k passes, corresponding resolution information, and an irradiation time calculation circuitry to calculate an irradiation time of a corresponding beam in the multi charged particle beams of a pass concerned by using input second irradiation time data and resolution information.

10 Claims, 11 Drawing Sheets

■Examination Object (Comparative Example)
Example) Case of 100 μC, 16 passes, shot bit upper limit 10 bits, current density 2A/cm² L/S = 0.5 (50%),
  MAX_Shot Time = (100 μC / 2A) / 16 passes / 0.5 = 6.25 μs
  Representing 6.25 μs by 10 bits, minimum resolution is 6.1 ns / grayscale (= 6250 ns / $2^{10}$)

■When required resolution is lower than or equal to 1 ns /grayscale, the above fixed bit does not satisfy accuracy.
  How many bits are needed for satisfying required minimum resolution ?
  → x satisfying 6250 ns / $2^x$ <1 ns / grayscale is x = 13.
  Although 13 bits are needed, since only 10 bits, it is impossible to perform representation.

■Case of data bus width of shot time being upper limit 10 bits corresponds to comparative example of first embodiment.
  Data for 16 passes should correspond to that for 2 passes.
  Therefore, calculation is performed using data for 8 passes.
  MAX_Shot Time = (100 μC / 2A) / 8 passes / 0.5 = 12.5 μs
  y satisfying 12500 ns / $2^y$ <1 ns / grayscale is y = 14.
  Thus, 14 bits are needed.
  When using 14 bits, minimum resolution is about 0.7 ns / grayscale [0.763 ns = 12500 / ($2^{14}$)].
  For representing this data of 14 bits by 2 passes, it should be performed to transmit 9 bits in high-order and write
  with rough accuracy of resolution $2^4 \times 0.7 = 11.2$ ns /grayscale, and should be performed to transmit 5 bits in low-order and
  write with high accuracy of resolution 0.7 ns / grayscale, for example.

FIG. 9

MULTI CHARGED PARTICLE BEAM WRITING APPARATUS, AND MULTI CHARGED PARTICLE BEAM WRITING METHOD

CROSS-REFERENCE TO RELATED APPLICATION

This application is based upon and claims the benefit of priority from the prior Japanese Patent Application No. 2015-064281 filed on Mar. 26, 2015 in Japan, the entire contents of which are incorporated herein by reference.

BACKGROUND OF THE INVENTION

Field of the Invention

Embodiments of the present invention relate generally to a multi charged particle beam writing apparatus and a multi charged particle beam writing method, and more specifically, to a method of reducing errors of beam irradiation time in performing multi-pass writing with multi-beams, for example.

Description of Related Art

The lithography technique that advances miniaturization of semiconductor devices is extremely important as a unique process whereby patterns are formed in semiconductor manufacturing. In recent years, with high integration of LSI, the line width (critical dimension) required for semiconductor device circuits progressively narrows year by year. An electron beam writing technique intrinsically having high resolution is used for writing or "drawing" a mask pattern on a mask blank with electron beams.

As an example employing the electron beam writing technique, a writing apparatus using multi-beams can be cited. Compared with the case of writing a pattern with a single electron beam, since in multi-beam writing it is possible to irradiate multiple beams at a time, the throughput can be greatly increased. For example, in a writing apparatus employing a multi-beam system, multi-beams are formed by letting portions of an electron beam emitted from an electron gun pass through a corresponding hole of a plurality of holes in the mask, blanking control is performed for each beam, each unblocked beam is diminished by an optical system to reduce a mask image and deflected by a deflector so as to irradiate a desired position on a target object or "sample".

Regarding the multi-beam writing, it is required to be highly accurate and highly speedy. To achieve the high accuracy, it is required to make the error between a desired dose and an actual irradiation dose small. As factors of cause generating the error of the dose, there can be cited the irradiation time resolution of irradiation time data, the performance of a deflector used for blanking control, and so on. When the irradiation time per shot of each beam is defined by n-bit data, the resolution of the irradiation time is defined by the value obtained by dividing the maximum irradiation time per shot by a grayscale value definable by n bits. Therefore, in order to make the error of the dose small, it is necessary to make irradiation time resolution small.

BRIEF SUMMARY OF THE INVENTION

According to one aspect of the present invention, a multi charged particle beam writing apparatus includes a dividing processing circuitry configured to input, for each beam irradiation position, first irradiation time data for k passes defined by n (n is an integer greater than or equal to 2) bits, and divide the first irradiation time data for the k passes into k pieces of second irradiation time data, where each of the k pieces of the second irradiation time data has a different number of bits from each other which has been preset and a total of different numbers of bits is n-bits, in multi-pass writing of k (k is an integer greater than or equal to 2) passes or greater than the k passes by using multi charged particle beams, a storage device configured to store k pieces of resolution information each defined based on a corresponding number of bits used in the k pieces of the second irradiation time data, a data transmission processing circuitry configured to transmit, for each pass of the k passes, corresponding second irradiation time data in the k pieces of the second irradiation time data, for a beam concerned in the multi charged particle beams, a resolution information transmission processing circuitry configured to transmit, for the each pass of the k passes, corresponding resolution information in the k pieces of the resolution information, an irradiation time calculation processing circuitry configured to input, for the each pass of the k passes, transmitted second irradiation time data and resolution information, and calculate an irradiation time of a corresponding beam in the multi charged particle beams of a pass concerned by using input second irradiation time data and resolution information, and a writing mechanism configured to write, for the each pass of the k passes, a pattern on a target object by using the multi charged particle beams including the corresponding beam of a calculated irradiation time.

According to another aspect of the present invention, a multi charged particle beam writing method includes inputting, for each beam irradiation position, first irradiation time data for k passes defined by n (n is an integer greater than or equal to 2) bits, and dividing the first irradiation time data for the k passes into k pieces of second irradiation time data, where each of the k pieces of the second irradiation time data has a different number of bits from each other which has been preset and a total of different numbers of bits is n-bits, in multi-pass writing of k (k is an integer greater than or equal to 2) passes or greater than the k passes by using multi charged particle beams, transmitting, for each pass of the k passes, corresponding second irradiation time data in the k pieces of the second irradiation time data, for a beam concerned in the multi charged particle beams, transmitting, for the each pass of the k passes, corresponding resolution information in k pieces of resolution information each defined based on a corresponding number of bits used in the k pieces of the second irradiation time data stored in a storage device, inputting, for the each pass of the k passes, transmitted second irradiation time data and resolution information, and calculating an irradiation time of a corresponding beam in the multi charged particle beams of a pass concerned by using input second irradiation time data and resolution information, and writing, for the each pass of the k passes, a pattern on a target object by using the multi charged particle beams including the corresponding beam of a calculated irradiation time.

BRIEF DESCRIPTION OF THE DRAWINGS

FIG. 9 shows an example for supplementing description of the first embodiment;

DETAILED DESCRIPTION OF THE INVENTION

For example, in the case of defining the maximum irradiation time of each beam shot by 10-bit data, for example, and performing irradiation of a currently assumed dose by multi-pass writing of sixteen passes, it has turned out that, for example, an error about twice as large as a target acceptable error of the dose occurs due to dose resolution (irradiation time resolution) in irradiation time data. Therefore, in order to suppress the error of the dose within a target acceptable error, it is necessary to make irradiation time resolution substantially small. Then, some measures can be cited in order to make irradiation time resolution small, such as reducing the maximum irradiation time per pass by increasing the number of passes (multiplicity) used in multi-pass writing, or increasing the number of bits of data for defining the irradiation time of each beam shot.

However, since the writing time becomes long if the number of passes (multiplicity) is increased or the number of bits of data is increased, it is not desirable to select the measure from the viewpoint of performing writing processing at high speed.

Then, in the embodiment below, there will be described a multi charged particle beam writing apparatus and method that can reduce the error of the dose without increasing the number of passes in multi-pass writing.

In the embodiment below, there will be described a configuration in which an electron beam is used as an example of a charged particle beam. The charged particle beam is not limited to the electron beam, and therefore, other charged particle beams such as an ion beam, etc. may also be used.

First Embodiment

Figure 1:
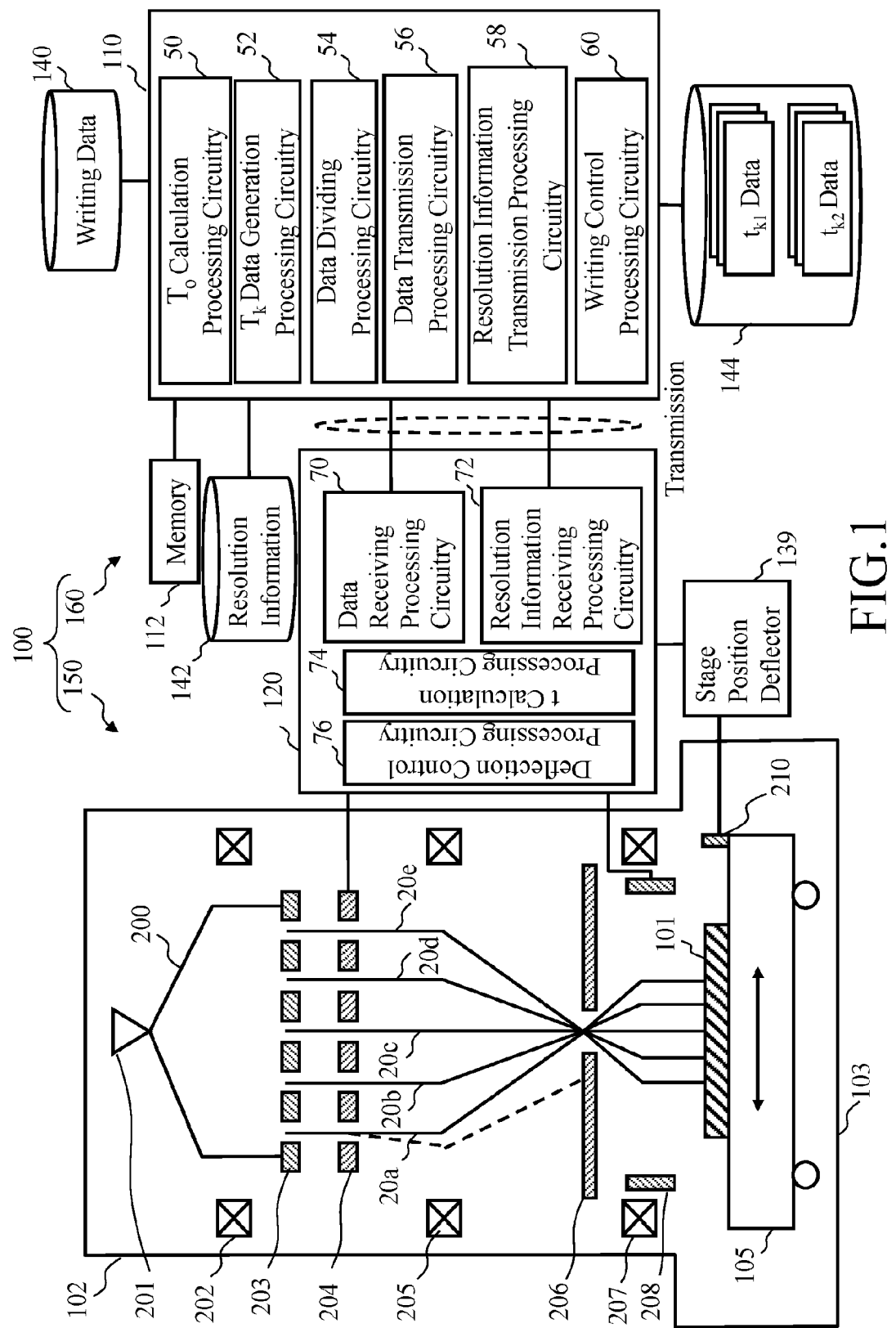
FIG. 1 is a schematic diagram showing a configuration of a writing apparatus according to a first embodiment.

FIG. 1 is a schematic diagram showing a configuration of a writing or "drawing" apparatus according to the first embodiment. As shown in FIG. 1, a writing apparatus 100 includes a writing mechanism 150 and a control unit 160. The writing apparatus 100 is an example of a multi charged particle beam writing apparatus. The writing mechanism 150 includes an electron optical column 102 and a writing chamber 103. In the electron optical column 102, there are arranged an electron gun 201, an illumination lens 202, a forming aperture array member 203, a blanking aperture array unit 204, a reducing lens 205, a limiting aperture member 206, an objective lens 207, and a deflector 208. In the writing chamber 103, an XY stage 105 is arranged. On the XY stage 105, there is placed a target object or "sample" 101 such as a mask blank serving as a writing target substrate when writing is performed. For example, the target object 101 is an exposure mask used for manufacturing semiconductor devices, or is a semiconductor substrate (silicon wafer) on which semiconductor elements are formed. A mirror 210 for measuring the position of the XY stage 105 is arranged on the XY stage 105.

The control unit 160 includes a control computer 110, a memory 112, a deflection control circuit 120, a stage position detector 139, and storage devices 140, 142, and 144 such as magnetic disk drives. The control computer 110, the memory 112, the deflection control circuit 120, the stage position detector 139, and the storage devices 140, 142, and 144 are connected with each other through a bus (not shown). Writing data is input into the storage device 140 (storage unit) from the outside of the writing apparatus 100 and stored therein. Resolution information to be described later is input into the storage device 142 (storage unit) from the outside of the writing apparatus 100 and stored therein. The control computer 110, the memory 112, and the storage devices 140, 142, and 144 are arranged separately from the deflection control circuit 120 and the stage position detector 139. For example, they are arranged in separate rooms. The deflection control circuit 120 and the stage position detector 139 are arranged close to the writing mechanism 150. It is preferable to connect, for example, by a high speed bus such as an optical fiber, etc. between the control computer 110, memory 112 and storage devices 140, 142, and 144, and the deflection control circuit 120 and stage position detector 139.

In the control computer 110, there are arranged a total irradiation time $t_0$ calculation unit 50, a $t_k$ data generation unit 52, a data dividing unit 54, a data transmission processing unit 56, a resolution information transmission processing unit 58, and a writing control processing circuitry 60. Each of the "units" such as the total irradiation time $t_0$ calculation unit 50, the $t_k$ data generation unit 52, the data dividing unit 54, the data transmission processing unit 56, and the resolution information transmission processing unit 58 includes a processing circuitry. The processing circuitry of each of the "units" and the writing control processing circuitry 60 include an electric circuit, a computer, a processor, a circuit board, a quantum circuit, or a semiconductor device, for example. Each of the "units" and the writing control processing circuitry 60 may use a common processing circuitry (same processing circuitry), or different processing circuitries (separate processing circuitries). Data which is input and output to/from the total irradiation time $t_0$ calculation unit 50, the $t_k$ data generation unit 52, the data dividing unit 54, the data transmission processing unit 56, the resolution information transmission processing unit 58, and the writing control processing circuitry 60, and data being operated are stored in the memory 112 each time.

In the deflection control circuit 120, there are arranged a data receiving unit 70, a resolution information receiving unit 72, an irradiation time t calculation unit 74, and a deflection control unit 76. Each of the "units" such as the data receiving unit 70, the resolution information receiving unit 72, the irradiation time t calculation unit 74, and the deflection control unit 76 includes a processing circuitry. The processing circuitry includes an electric circuit, a computer, a processor, a circuit board, a quantum circuit, or a semiconductor device, for example. Each of the "units" may use a common processing circuitry (same processing circuitry), or different processing circuitries (separate processing circuitries). Data which is input and output to/from the data receiving unit 70, the resolution information receiving unit 72, the irradiation time t calculation unit 74, and the deflection control unit 76, and data being operated are stored in the memory (not shown) each time.

FIG. 1 shows a configuration necessary for explaining the first embodiment. Other configuration elements generally necessary for the writing apparatus 100 may also be included.

Figure 2A:
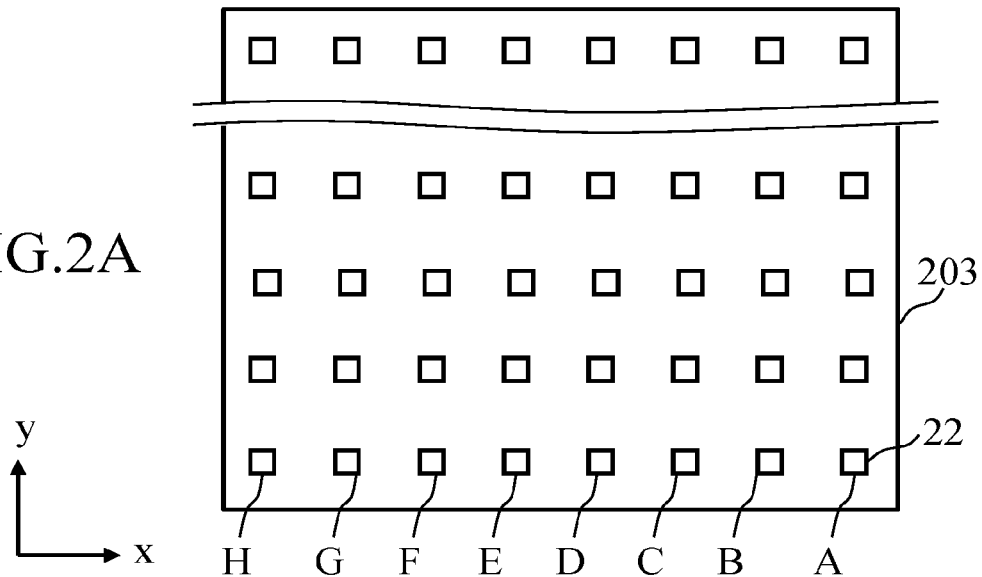
FIGS. 2A and 2B are conceptual diagrams each showing a configuration of a forming aperture array member according to the first embodiment.
Figure 2B:
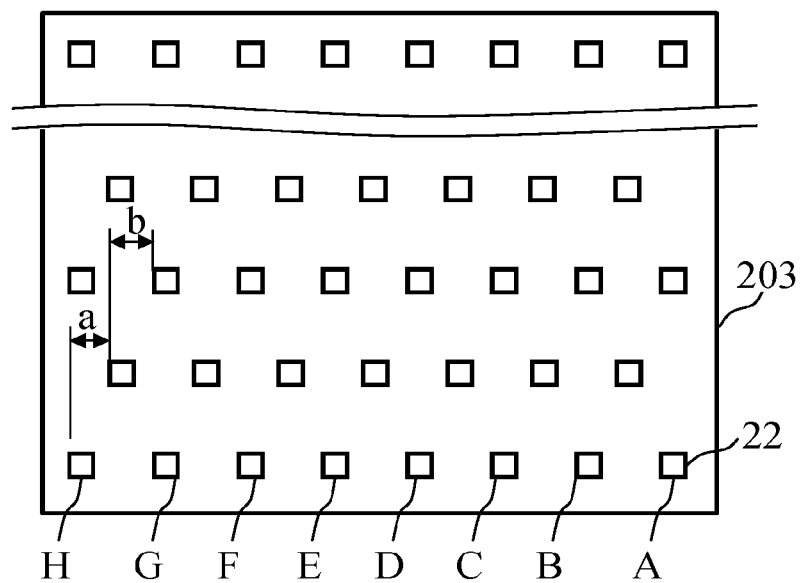

FIGS. 2A and 2B are conceptual diagrams each showing an example of the configuration of a forming aperture array member according to the first embodiment. As shown in FIG. 2A, holes (openings) 22 of m rows long (y direction) and n columns wide (x direction) (m≥2, n≥2) are formed, like a matrix, at a predetermined arrangement pitch in the forming aperture array member 203. In FIG. 2A, for example, holes 22 of 512 (rows)×8 (columns) are formed. Each of the holes 22 is a quadrangle of the same dimensional shape. Alternatively, each of the holes 22 can be a circle of the same circumference. Here, there is shown an example in which each of the rows arrayed in the y direction has eight holes 22 from A to H in the x direction. Multi-beams 20 are formed by letting portions of an electron beam 200 individually pass through a corresponding hole of a plurality of holes 22. The case in which the holes 22 of a plurality of rows and columns are arranged in both the x and the y directions is shown here, but the arrangement is not limited thereto. For example, it is also acceptable that a plurality of holes 22 are arranged in only one row (x direction) or in only one column (y direction). That is, in the case of only one row, a plurality of holes 22 are arranged as a plurality of columns, and in the case of only one column, a plurality of holes 22 are arranged as a plurality of rows. Moreover, the method of arranging the holes 22 is not limited to the case of FIG. 2A where holes are arranged like a grid in the length and width directions. For example, as shown in FIG. 2B, as to the first and second rows arrayed in the length direction (y direction), each hole in the first row and each hole in the second row may be mutually displaced in the width direction (x direction) by a dimension "a". Similarly, as to the second and third rows arrayed in the length direction (y direction), each hole in the second row and each hole in the third row may be mutually displaced in the width direction (x direction) by a dimension "b", for example.

Figure 3:
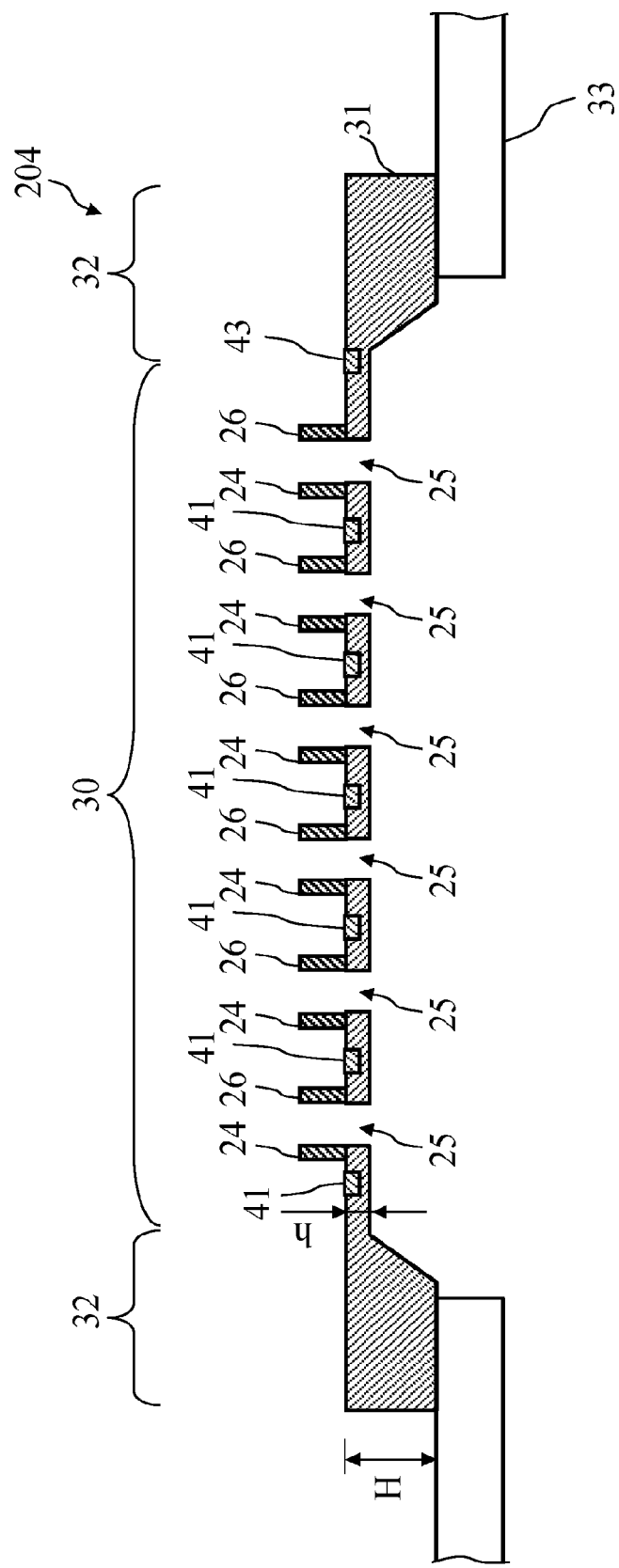
FIG. 3 is a sectional view showing a configuration of a blanking aperture array unit according to the first embodiment.
Figure 4:
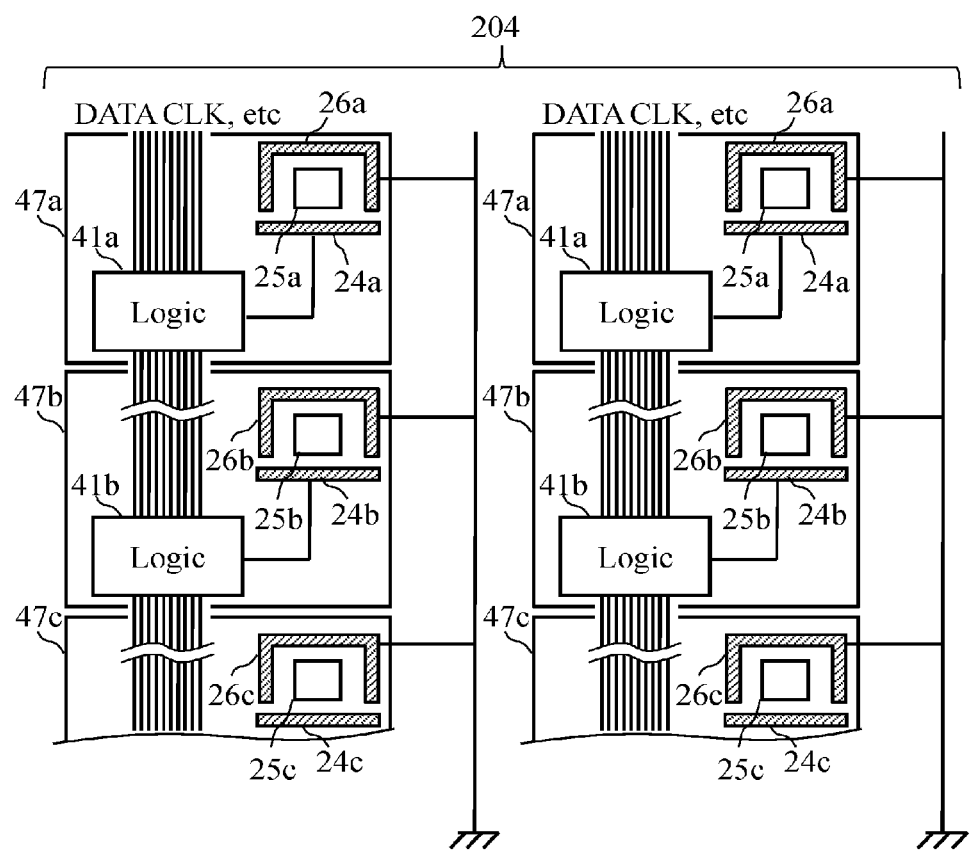
FIG. 4 is a top view conceptual diagram showing a part of a configuration in a membrane region of a blanking aperture array unit according to the first embodiment.

FIG. 3 is a sectional view showing a configuration of a blanking aperture array unit according to the first embodiment. FIG. 4 is a top view conceptual diagram showing a part of the configuration in a membrane region of a blanking aperture array unit according to the first embodiment. In FIGS. 3 and 4, the positional relation between a control electrode 24 and an counter electrode 26, and the positional relation between control circuits 41 and 43 are not in accordance with each other. With regard to the configuration of the blanking aperture array unit 204, as shown in FIG. 3, a semiconductor substrate 31 made of silicon, etc. is placed on a support table 33. The central part of the substrate 31 is shaved from the back side and processed to be a membrane region 30 (first region) having a thin film thickness h. The circumference surrounding the membrane region 30 is a circumference region 32 (second region) having a thick film thickness H. The upper surface of the membrane region 30 and the upper surface of the circumference region 32 are formed to be at the same height position, or substantially at the same height position. At the backside of the circumference region 32, the substrate 31 is supported to be on the support table 33. The central part of the support table 33 is open, and the position of the membrane region 30 is located in the opening part of the support table 33.

In the membrane region 30, there are formed passage holes 25 (openings) through which multi-beams individually pass at the positions each corresponding to each hole 22 of the forming aperture array member 203 shown in FIG. 2A (or 2B). Then, as shown in FIGS. 3 and 4, pairs each composed of the control electrode 24 and the counter electrode 26 (blanker: blanking deflector) for blanking deflection are arranged on the membrane region 30, where each pair is close to a corresponding passage hole 25, and the control electrode 24 and the counter electrode 26 are at opposite sides of the corresponding passage hole 25. Moreover, close to each passage hole 25 in the membrane region 30, there is arranged the control circuit 41 (logic circuit) for applying a deflection voltage to the control electrode 24 for each passage hole 25. The counter electrode 26 for each beam is earthed (grounded).

Moreover, as shown in FIG. 4, for example, 9-bit parallel lines for control signals are connected to each control circuit 41. In addition to the 9-bit parallel lines for controlling, for example, clock signal lines and wiring lines for a power source are connected to each control circuit 41. A part of the parallel lines may be used as the clock signal lines and the power source wiring lines. An individual blanking mechanism 47 composed of the control electrode 24, the counter electrode 26, and the control circuit 41 is configured for each beam of the multi-beams. In the example of FIG. 3, the control electrode 24, the counter electrode 26, and the control circuit 41 are arranged in the membrane region 30 having a thin film thickness of the substrate 31. However, it is not limited thereto.

The electron beam 20 passing through a corresponding passage hole 25 is deflected by a voltage independently applied to the two electrodes 24 and 26 being a pair. Blanking control is performed by this deflection. In other words, each pair of the control electrode 24 and the counter electrode 26 blanking deflects a corresponding beam of multi-beams each having passed through a corresponding one of a plurality of holes 22 (openings) of the forming aperture array member 203.

Operations of the writing mechanism 150 in the writing apparatus 100 will be described below. The electron beam 200 emitted from the electron gun 201 (emitter) almost perpendicularly (e.g., vertically) illuminates the whole of the forming aperture array member 203 by the illumination lens 202. A plurality of holes (openings) each being a quadrangle are formed in the forming aperture array member 203. The region including all the plurality of holes is irradiated by the electron beam 200. For example, a plurality of quadrangular electron beams (multi-beams) 20a to 20e are formed by letting portions of the electron beam 200 which irradiate the positions of a plurality of holes individually pass through a corresponding hole of the plurality of holes of the forming aperture array member 203. The multi-beams 20a to 20e individually pass through a corresponding blanker (first deflector: individual blanking mechanism) of the blanking aperture array unit 204. Each blanker deflects (blanking deflects) the electron beam 20 which is individually passing.

The multi-beams 20a, 20b, . . . , 20e having passed through the blanking aperture array unit 204 are reduced by the reducing lens 205, and go toward the hole in the center of the limiting aperture member 206. At this stage, the electron beam 20 which was deflected by the blanker of the blanking aperture array unit 204 deviates from the hole in the center of the limiting aperture member 206 and is blocked by the limiting aperture member 206. On the other hand, the electron beam 20 which was not deflected by the blanker of the blanking aperture array unit 204 passes through the hole in the center of the limiting aperture member 206 as shown in FIG. 1. Blanking control is performed by ON/OFF of the individual blanking mechanism so as to control ON/OFF of beams. Thus, the limiting aperture member 206 blocks each beam which was deflected to be in a beam OFF state by the individual blanking mechanism. Then, one shot beam is formed by a beam which has been made during a period from becoming a beam ON state to becoming a beam OFF state and has passed through the limiting aperture member 206. The multi-beams 20 having passed through the limiting aperture member 206 are focused by the objective lens 207 in order to be a pattern image of a desired reduction ratio, and respective beams (the entire multi-beams 20) having passed through the limiting aperture member 206 are collectively deflected in the same direction by the deflector 208 in order that respective beam irradiation positions on the target object 101 may be irradiated. While the XY stage 105 is continuously moving, controlling is performed by the deflector 208 so that irradiation positions of beams may follow (track) the movement of the XY stage 105, for example. The position of the XY stage 105 is measured by way of radiating a laser from the stage position detector 139 to the mirror 210 on the XY stage 105 and using its catoptric light. The multi-beams 20 irradiating at the same time are ideally aligned at pitches obtained by multiplying the arrangement pitch of a plurality of holes of the forming aperture array member 203 by a desired reduction ratio described above. The writing apparatus 100 performs a writing operation by the irradiation of multi-beams 20, used as shot beams, per pixel by moving the beam deflection position by the deflector 208 along a writing sequence controlled by the writing control processing circuitry 60 while following the movement of the XY stage 105 during each tracking operation. When writing a desired pattern, a beam required according to a pattern is controlled to be ON by blanking control.

Figure 5:
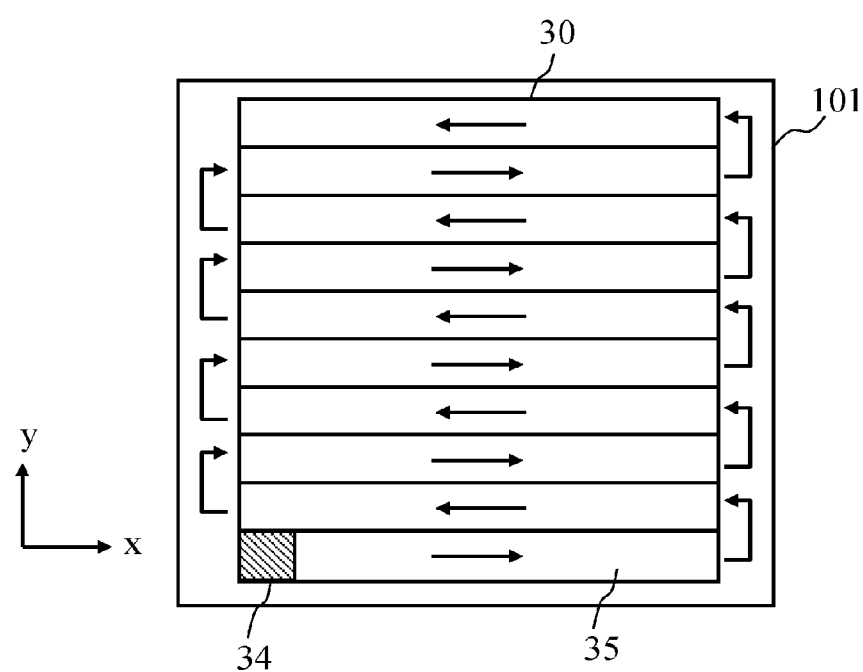
FIG. 5 illustrates a writing order according to the first embodiment.

FIG. 5 illustrates a writing order according to the first embodiment. A writing region 31 (or chip region to be written) of the target object 101 is divided into strip-shaped stripe regions 35 each having a predetermined width. Then, each stripe region 35 is virtually divided into a plurality of mesh regions (pixels). Preferably, the size of the mesh region (pixel) is, for example, a beam size, or smaller than a beam size. For example, the size of the pixel region is preferably about 10 nm. The mesh region (pixel) serves as a unit region for irradiation per beam of multi-beams.

When writing the target object 101 with the multi-beams 20, an irradiation region 34 is irradiated by one-time irradiation of the multi-beams 20. As described above, irradiation is collectively performed per pixel sequentially and continuously with multi-beams 20 being shot beams by moving the beam deflection position by the deflector 208 while following the movement of the XY stage 105 during the tracking operation. It is determined, based on the writing sequence, which beam of multi-beams irradiates which pixel on the target object 101. The region of the beam pitch (x direction) multiplied by the beam pitch (y direction), where the beam pitch is between beams adjoining in the x or y direction of multi-beams on the surface of the target object 101, is configured by a region (sub-pitch region) composed of n×n pixels. For example, when the XY stage 105 moves in the −x direction by the length of beam pitch (x direction) by one tracking operation, n pixels are written in the x or y direction (or diagonal direction) by one beam while the irradiation position is shifted. Then, by the next tracking operation, another n pixels in the same n×n pixel region are similarly written by a different beam from the one used above. Thus, n pixels are written each time of n times of tracking operations, using a different beam each time, thereby writing all the pixels in one region of n×n pixels. With respect also to other regions each composed of n×n pixels in the irradiation region of multi-beams, the same operation is performed at the same time to be written similarly. This operation makes it possible to write all the pixels in the irradiation region 34. By repeating this operation, the entire corresponding stripe region 35 can be written.

Figure 6:
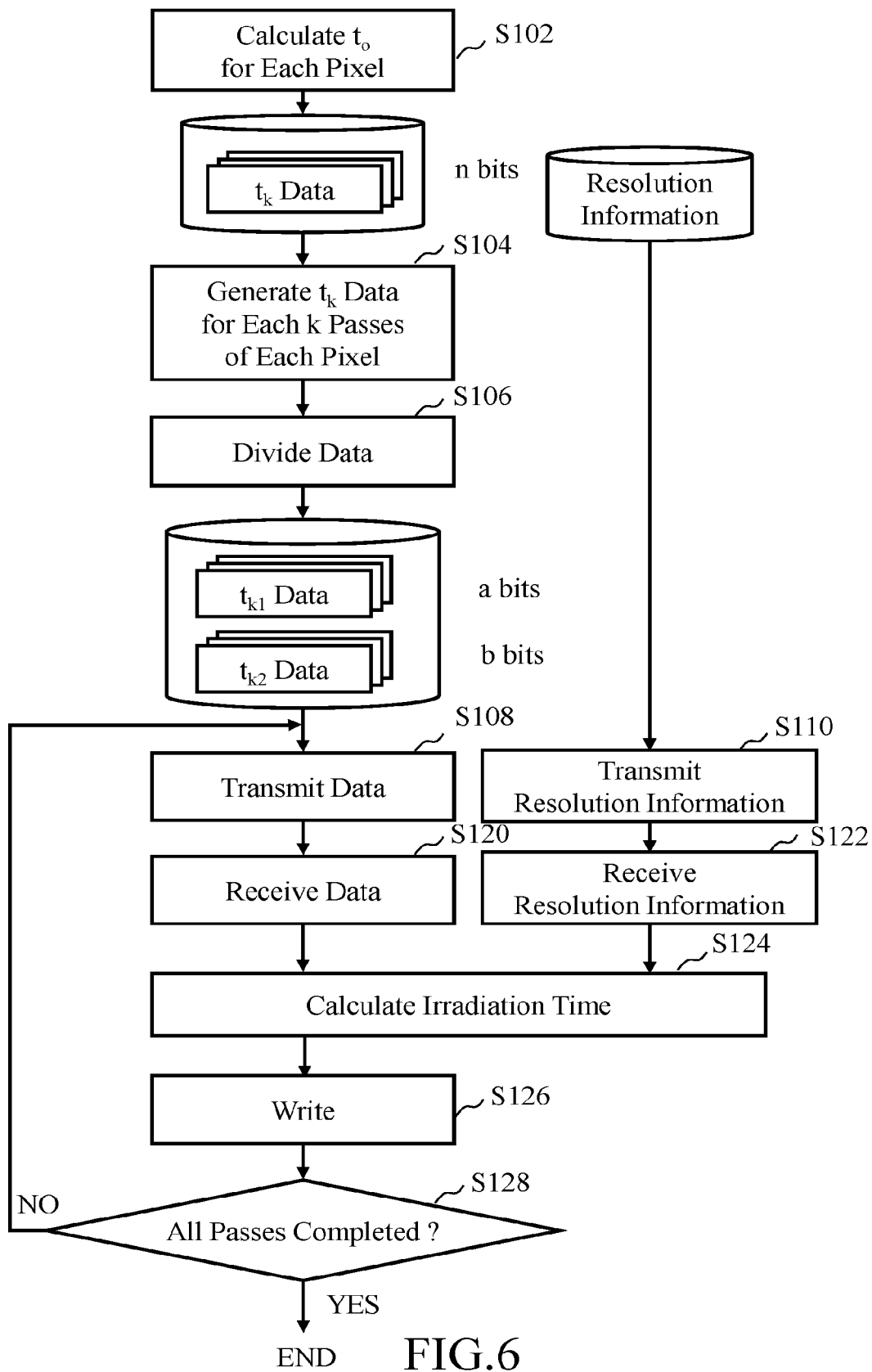
FIG. 6 is a flowchart showing main steps of a writing method according to the first embodiment.

FIG. 6 is a flowchart showing main steps of a writing method according to the first embodiment. As shown in FIG. 6, a series of steps of a total irradiation time $t_0$ calculation step (S102) for each pixel, an irradiation time $t_k$ data generating step (S104) for each k passes of each pixel, a data dividing step (S106), a data transmission step (S108), a resolution information transmission step (S110), a data receiving step (S120), a resolution information receiving step (S122), an irradiation time calculation step (S124), a writing step (S126), and a determination step (S128) are executed.

Figure 7A:
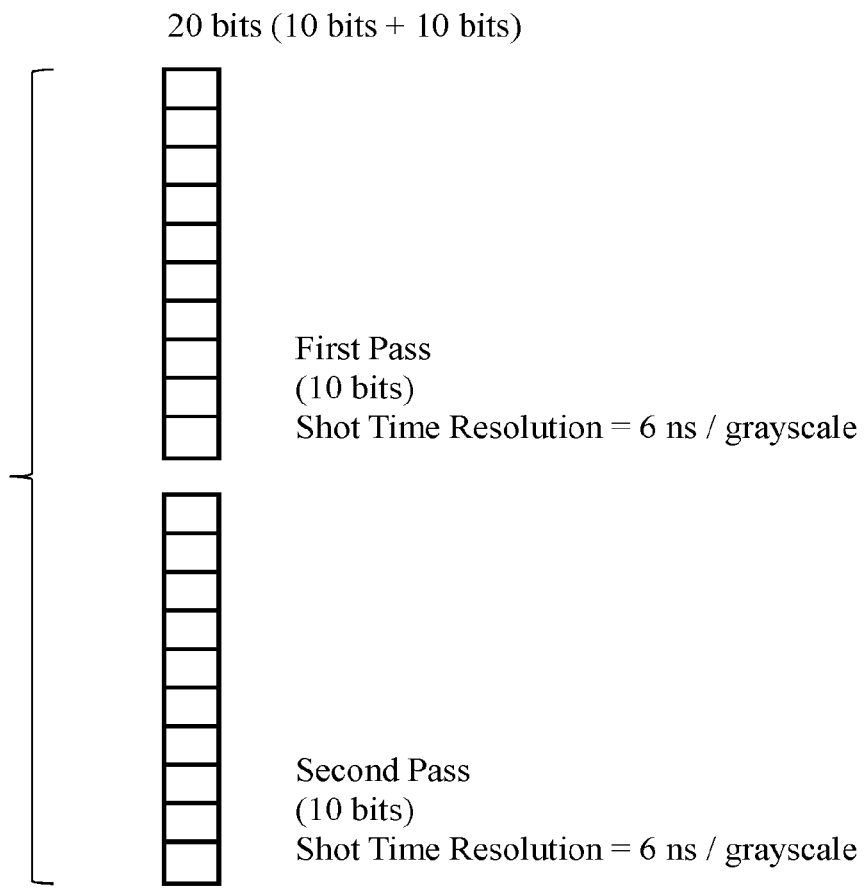
FIGS. 7A and 7B show an example of irradiation time data for k passes according to the first embodiment, and an example of irradiation time data for k passes according to a comparative example.
Figure 7B:
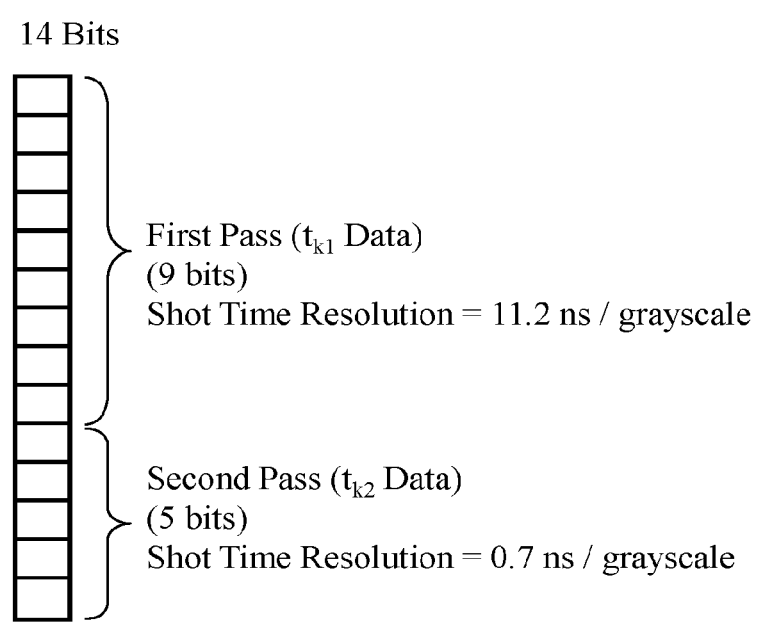

FIGS. 7A and 7B show an example of irradiation time data for k passes according to the first embodiment, and an example of irradiation time data for k passes according to a comparative example. FIG. 7A shows shot data for two passes, for example, according to the comparative example. In the comparative example, for example, 10-bit irradiation time data is generated for each pass. Therefore, 20-bit shot data is generated for two passes. Irradiation time resolution v of n-bit data can be defined by the equation (1) below using a maximum irradiatable dose D' that is irradiatable in the writing apparatus 100, a current density J, and a multiplicity (the number of passes) N of multi-pass writing.

$$v=(D'/J)\cdot(1/N)/(2^n) \quad (1)$$

Now, it is assumed, for example, that multi-pass writing of sixteen passes is performed for a line and space pattern whose pattern area density is 50%, under the condition of the dose being 100 μC and the current density J being 2A. An actual dose is calculated by multiplying the reference dose by the pattern area density. Therefore, a maximum irradiatable dose is set to be 200 μC. In such a case, according to the comparative example shown in FIG. 7A, the irradiation time resolution v of irradiation time data (shot data) of 10-bit irradiation time data for one pass is $(200000/2)\cdot(1/16)/(2^{10}){\approx}6$ ns/grayscale. Therefore, the total irradiation time error (dose error) of each pixel is 16 passes×6 ns=96 ns. On the other hand, the total maximum irradiation time of each pixel in the case of writing the line and space pattern whose pattern area density is 50% is 200000C/2A=50000 ns. Therefore, the error (dose error) rate to the total irradiation time of each pixel is 96/50000≈0.002 (0.2%). In order to suppress the target acceptable error of the dose within 0.1%, it is necessary to make the irradiation time resolution v of irradiation time data less than or equal to 3 ns/grayscale. Moreover, as described above, as factors of cause generating the error of the dose, there can be cited the irradiation time resolution of irradiation time data, the performance of each blanker (deflector used for blanking control) of the blanking aperture array unit 204, and so on. When taking such an error into account, it is desirable to make the irradiation time resolution v of irradiation time data less than or equal to 1 ns/grayscale.

Since the irradiation time resolution can be reduced to one-half whenever the number of bits of irradiation time data is increased by 1 bit, if the irradiation time resolution v of 10-bit irradiation time data is 6 ns/grayscale, it is possible to make the irradiation time resolution v less than or equal to 1 ns/grayscale (about 0.7 ns/grayscale) by using 14-bit irradiation time data. However, if the irradiation time data of each pass is changed to 14 bits from 10 bits, the data transmission time will be long.

Then, according to the first embodiment, irradiation time data for k passes is defined by the number of bits needed to make the irradiation time resolution v less than or equal to 1 ns/grayscale, for example. FIG. 7B shows the case where irradiation time data for two out of sixteen passes is defined by 14 bits, for example. By this, the irradiation time resolution v of the irradiation time data for two passes can be less than or equal to 1 ns/grayscale (about 0.7 ns/grayscale). Then, the number of bits of the high-order digits are assigned, for example, to the first pass, and the number of bits of the low-order digits are assigned, for example, to the second pass. The irradiation time of each pass does not need to be uniform. It is sufficient that the total of irradiation time of all the passes is the irradiation time corresponding to a desired dose. In this case, the total of irradiation time of the first and second passes should be the irradiation time for two passes being a target. In the example of FIG. 7B, low-order 5 bits (from the first digit to the fifth digit) are assigned, for example, to the second pass, and remaining high-order 9 bits (from the sixth digit to the fourteenth digit) are assigned, for example, to the first pass. Then, as will be described later, the 14-bit irradiation time data for two passes is used after being divided into irradiation time data of high-order 9 bits (from the sixth digit to the fourteenth digit) and irradiation time data of low-order 5 bits (from the first digit to the fifth digit).

In the case of FIG. 7B, the irradiation time for two passes (two shots) is defined by the value calculated by multiplying one of grayscale values $2^{13}, 2^{12}, 2^{11}, 2^{10}, 2^9, 2^8, 2^7, 2^6, 2^5, 2^4, 2^3, 2^2, 2^1$, and $2^0$, a grayscale value obtained by combining these grayscale values, or a grayscale value 0 by the irradiation time resolution v. That is, values calculated by multiplying one of the grayscale values from 0 to 16383 by the irradiation time resolution v can be defined. According to the first embodiment, with respect to irradiation time data of the second pass (second shot), one of grayscale values of $2^4, 2^3, 2^2, 2^1$, and $2^0$ of low-order 5 bits, a grayscale value obtained by combining these grayscale values, or a grayscale value 0 is used as irradiation time data ($t_{k2}$ data). Therefore, the irradiation time of the first pass (first shot), namely the remaining irradiation time, is a value calculated by multiplying one of grayscale values $2^{13}, 2^{12}, 2^{11}, 2^{10}, 2^9, 2^8, 2^7, 2^6$, and $2^5$ of high-order 9 bits, a grayscale value obtained by combining these grayscale values, or a grayscale value 0 by the irradiation time resolution v.

Thereby, the irradiation time resolution by the low-order 5 bits can be maintained to be the irradiation time resolution v (about 0.7 ns/grayscale) by the original 14 bits. On the other hand, the irradiation time resolution by the high-order 9 bits cannot be maintained to be the irradiation time resolution v (about 0.7 ns/grayscale) by the original 14 bits since the low-order 5 bits are separated off. For example, if assuming that the irradiation time is 22.4 ns, when the irradiation time resolution v is 0.7 ns/grayscale, the grayscale value is $2^5$, i.e., 32. If defined using 14-bit data, it is "00000000100000". On the other hand, as shown in FIG. 7B, when the low-order 5 bits are separated off, the 14-bit data becomes 9-bit data "000000001". In the 9-bit data, it is set to define one of grayscale values $2^9, 2^8, 2^7, 2^6, 2^5, 2^4, 2^3, 2^2$ and $2^1$, excluding $2^0$, a grayscale value obtained by combining these grayscale values, or a grayscale value 0. In such a case, with respect to the 9-bit data "000000001", since the grayscale value is $2^1$, i.e., 2, the irradiation time resolution of the 9-bit data needs to be 11.2 ns/grayscale in order to make the irradiation time be 22.4 ns. As to n-bit data whose irradiation time resolution is v, the irradiation time resolution by high-order "a" bits is $v \cdot 2^{(b-1)}$ since the low-order "b" bits of the irradiation time resolution v have been separated off. However, note that n=a+b.

As described above, in the case of FIG. 7B, the irradiation time resolution of the irradiation time data ($t_{k1}$ data) of the high-order 9 bits of the first pass is 11.2 ns/grayscale, and the irradiation time resolution of the data ($t_{k2}$ data) of the low-order 5 bits of the second pass is 0.7 ns/grayscale.

Thus, according to the first embodiment, the irradiation time resolution is variably set with respect to irradiation time data for k passes.

In the total irradiation time $t_0$ calculation step (S102), the total irradiation time $t_0$ calculation unit 50 calculates, for each pixel (beam irradiation position) on the target object 101, an irradiation time (total irradiation time $t_0$) to irradiate the pixel concerned. For example, it is calculated, per stripe region 35, for each pixel region in the stripe region 35 concerned. Total irradiation time $t_0$ can be calculated by dividing a total dose by a current density J. First, the pattern area density calculation unit (not shown) in the control computer 110 reads writing data from the storage device 140, and calculates the area density of a pattern arranged in each of a plurality of pixel regions (mesh regions) obtained by virtually dividing the writing region of the target object 101 or a chip region to be written into meshes. For example, first, the writing region of the target object 101 or a chip region to be written is divided into strip-shaped stripe regions 35 each having a predetermined width. Then, each stripe region 35 is virtually divided into a plurality of pixel regions described above. It is preferable that the size of the pixel region is, for example, a beam size, or smaller than the beam size. For example, the size of the pixel region is preferably about 10 nm. The area density calculation unit (not shown) reads corresponding writing data, for example, for each stripe region from the storage device 140, and puts (assigns) a plurality of figure patterns defined in the writing data in a plurality of pixel regions. Then, the area density of a figure pattern arranged in each pixel region is calculated.

The total irradiation time $t_0$ calculation unit 50 calculates, for each pixel region, a total irradiation time $t_0$ (which hereinafter will also be referred to as "shot time" or "exposure time") of an electron beam. The total value of irradiation time of the electron beams in all the passes of multi-pass writing is calculated. It is preferable to obtain a total irradiation time $t_0$ to be in proportion to the area density of a calculated pattern. Moreover, the total irradiation time $t_0$ may be a time equivalent to a dose after correction, that is a dose having been corrected with respect to a dimension variation amount generated due to a phenomenon (not shown) causing dimension variation, such as a proximity effect, a fogging effect, or a loading effect. The size of the mesh region used for calculation of correcting the phenomenon (not shown) causing dimension variation, such as a proximity effect, a fogging effect, or a loading effect and the size of the pixel region may be different from each other. Total irradiation time $t_0$ for each pixel region is defined in a total irradiation time map, which is stored in the storage device 144, for example.

In the irradiation time $t_k$ data generating step (S104) for each k passes of each pixel, the $t_k$ data generation unit 52 generates irradiation time $t_k$ data (first irradiation time data)

for k passes defined by n (n is an integer greater than or equal to 2) bits, for each pixel region (beam irradiation position) on the surface of the target object 101, in multi-pass writing of k (k is an integer greater than or equal to 2) or more passes using multi-beams 20. For example, 14-bit irradiation time $t_k$ data (first irradiation time data) is generated as shown in the example of FIG. 7B. The number n of bits of data is not limited to 14 bits, but is required to be a value from which a desired irradiation time resolution can be obtained. The value may be smaller than 14 bits or greater than it. Specifically, for example, it is obtained, for each pixel region, by dividing the total irradiation time $t_0$ by the value of 1/k of the number of passes, N. For example, when performing calculation per two passes in multi-pass writing of sixteen passes, the value is obtained for each pixel by dividing the total irradiation time $t_0$ by 8 which is half the number of passes, 16. However, it is not limited thereto. The irradiation time of the first two continuous passes in the sixteen passes may be different from that of other continuous two passes.

Thus, according to the first embodiment, since the irradiation time (dose) is calculated for each k passes, calculation processing can be reduced to 1/k of the case where the irradiation time (dose) is calculated for each pass. Since, in the case of FIG. 7B, the irradiation time (dose) is calculated for each two passes in multi-pass writing of sixteen passes, calculation can be finished by performing the processing eight times. The irradiation time $t_k$ data for each k passes defined by n bits is defined in an irradiation time $t_k$ map, which is stored in the storage device 144.

In the data dividing step (S106), for each pixel region (beam irradiation position) in multi-pass writing of k or more passes using multi-beams, the data dividing unit 54 (dividing unit) reads/inputs irradiation time $t_k$ data (first irradiation time data) for k passes, which is defined by n bits, from the storage device 144, and divides it into k pieces of irradiation time data (second irradiation time data), where each of the k pieces of the data has a different number of bits which has been preset and the total of the different numbers of bits is n-bits. For example, the irradiation time $t_k$ data for two passes is divided into irradiation time $t_{k1}$ data for the first pass and irradiation time $t_{k2}$ data for the second pass. Regarding the k pieces of irradiation time data (second irradiation time data), the irradiation time making irradiation time resolution (resolution) stay within a desired value is defined in the irradiation time data whose number of bits to be used is the smaller (or "smallest"). Then, the remaining irradiation time is defined in the irradiation time data whose number of bits to be used is the greater (or "greatest") in the k pieces of irradiation time data. In the case of FIG. 7B, the 14-bit irradiation time $t_k$ data is divided into irradiation time $t_{k1}$ data of the high-order 9 bits for the first pass, and the irradiation time $t_{k2}$ data of the low-order 5 bits for the second pass. The dividing position is not limited to, between the fifth and sixth bits in the low-order bits, and it may be set at another position. However, since the irradiation time resolution of the irradiation time defined by lower-order bit data is small, the defined irradiation time is short. By contrast, since the irradiation time resolution of the irradiation time defined by high-order bit data is large, the defined irradiation time is long. Therefore, in order not to stagnate the writing processing, it is desirable to accelerate the transmission time to be described later of the low-order bit data. By contrast, it is acceptable to slow the transmission time to be described later of high-order bit data. Therefore, in order to reduce the data amount, "b" being the number of bits of low-order bit data whose irradiation time resolution has been decreased is preferably smaller than "a" being the number of bits of high-order bit data whose irradiation time resolution has been increased.

Now, regarding the storage device 142 (storage unit), there are stored k pieces of resolution information defined based on the number of bits used in k pieces of irradiation time data (second irradiation time data), such as irradiation time $t_{k1}$ data, irradiation time $t_{k2}$ data and so on. In the case of FIG. 7B, as the resolution information, there are stored resolution information $v_1$ (11.2 ns/grayscale) of the irradiation time $t_{k1}$ data of the first pass and resolution information $v_2$ (0.7 ns/grayscale) of the irradiation time $t_{k2}$ data of the second pass which are divided from the irradiation time $t_k$ data for k passes.

In the data transmission step (S108), the data transmission processing unit 56 transmits, for each pass of k passes, corresponding irradiation time data (second irradiation time data) in k pieces of irradiation time data for the beam concerned of the multi-beams 20 to the deflection control circuit 120. Specifically, with respect to irradiation time $t_{k1}$ data for the first pass and irradiation time $t_{k2}$ data for the second pass which have been generated for each two passes in sixteen passes, the data transmission processing unit 56 transmits the irradiation time $t_{k1}$ data at data transmission of the first pass, and the irradiation time $t_{k2}$ data at data transmission of the second pass. According to the first embodiment, the number of bits of data can be reduced such as from 20 bits for the two passes in the comparative example shown in FIG. 7A to 14 bits for the two passes as shown in FIG. 7B. Therefore, the total transmission time for two passes can be shortened compared to the comparative example shown in FIG. 7A. Moreover, according to the first embodiment, depending on the dividing position of data, the transmission time of the first or/and second pass can be shortened compared to the comparative example shown in FIG. 7A. In other words, high speed can be accomplished.

In the resolution information transmission step (S110), the resolution information transmission processing unit 58 transmits, for each pass of k passes, corresponding resolution information in k pieces of resolution information to the deflection control circuit 120. In the case of FIG. 7B, the resolution information transmission processing unit 58 transmits, at the first pass of the two passes, data representing the value of 11.2 as resolution information, and transmits, at the second pass, data representing the value of 0.7 as resolution information. It is preferable that the irradiation time $t_{k1}$ data, and the data representing the value 11.2, for example, as resolution information on the first pass are transmitted in parallel at data transmission of the first pass. Similarly, it is preferable that the irradiation time $t_{k2}$ data, and the data representing the value of 0.7, for example, as resolution information on the second pass are transmitted in parallel at data transmission of the second pass. The transmission time can be shortened by transmitting them in parallel.

In the data receiving step (S120), the data receiving unit 70 receives, for each pass of k passes, transmitted irradiation time data (second irradiation time data). Specifically, the data receiving unit 70 receives irradiation time $t_{k1}$ data at the first pass of two passes, and irradiation time $t_{k2}$ data at the second pass.

In the resolution information receiving step (S122), the resolution information receiving unit 72 receives, for each pass of k passes, transmitted resolution information. Specifically, the resolution information receiving unit 72 receives, at the first pass of the two passes, data representing the value 11.2, for example, as resolution information on the first pass, and receives, at the second pass, data representing the value 0.7, for example, as resolution information on the second pass.

In the irradiation time calculation step (S124), the irradiation time t calculation unit 74 inputs, for each pass of k passes, transmitted irradiation time data (second irradiation time data) and resolution information, and calculates an irradiation time t of a corresponding beam of the multi-beams 20 in the pass concerned by using the input irradiation time data and resolution information. Specifically, the irradiation time t calculation unit 74 calculates, with respect to the first pass, a value by multiplying the grayscale value defined in the irradiation time $t_{k1}$ data by irradiation time resolution $v \cdot 2^{(b-1)}$. Similarly, the irradiation time t calculation unit 74 calculates, with respect to the second pass, a value by multiplying the grayscale value defined in the irradiation time $t_{k2}$ data by irradiation time resolution v. In the case of FIG. 7B, the irradiation time t calculation unit 74 calculates, with respect to the first pass, a value by multiplying one of grayscale values $2^9$, $2^8$, $2^7$, $2^6$, $2^5$, $2^4$, $2^3$, $2^2$, and $2^1$, excluding $2^0$, in the case of, for example, 9-bit data, a grayscale value obtained by combining these grayscale values, or a grayscale value 0, by 11.2 being irradiation time resolution. Similarly, the irradiation time t calculation unit 74 calculates, with respect to the second pass, a value by multiplying one of grayscale values $2^4$, $2^3$, $2^2$, $2_1$, and $2^0$ in the case of, for example, 5-bit data, a grayscale value obtained by combining these grayscale values, or a grayscale value 0, by 0.7 being irradiation time resolution.

In the writing step (S126), the deflection control unit 76 outputs, for each shot, irradiation time t data to the control circuit 41 for each beam. Then, the writing mechanism 150 writes, for each pass of k passes, a pattern on the target object 101 by using the multi-beams 20 including a beam corresponding to a calculated irradiation time t. As described above, the writing mechanism 150 writes the target object 101 while moving the XY stage 105. In that case, with respect to k pieces of irradiation time data, the writing control processing circuitry 60 controls such that the moving speed of the XY stage 105 at the pass using irradiation time data with the greater (or "greatest") number of bits is slower than the moving speed of the XY stage 105 at the pass using irradiation time data with the smaller (or "smallest") number of bits. In the case of FIG. 7B, the moving speed of the XY stage 105 of the first pass is controlled to be slower than that of the second pass. Since the irradiation time of the first pass is defined by data with the greater number of bits of high-order bits, it is longer than the irradiation time defined by data with the smaller number of bits of low-order bits. Therefore, the position of the target object 101 on the stage can be prevented from being out of the writable range during the writing, by making the moving speed of the stage slow. By contrast, the irradiation time of the second pass is short. Therefore, writing can be completed even if the moving speed of the stage is made to be fast. It is only necessary for the total of the moving time of the stage of the first and second passes to be the same or shorter than the total of the moving time of the stage of two passes with the same number of bits as in the comparative example shown in FIG. 7A.

In the determination step (S128), the writing control processing circuitry 60 in the control computer 110 determines whether all the passes of multi-pass writing have been completed. If all the passes have been completed, it ends, and if all the passes have not been completed yet, it returns to the data transmission step (S108) in order to repeat the steps from the data transmission step (S108) to the determination step (S128) until all the passes have been completed.

In addition, although the irradiation time resolution of the irradiation time $t_{k1}$ data, where the writing time is long, of the first pass is larger than a desired irradiation time resolution v, since the irradiation time resolution of the irradiation time $t_{k2}$ data, where the writing time is short, of the second pass maintains high irradiation time resolution v, it becomes possible, as a result of k passes, to write with high irradiation time resolution v. When writing is achieved with high irradiation time resolution v, the dose error can be reduced.

As described above, according to the first embodiment, the dose error can be reduced without increasing the number of passes in multi-pass writing. Thus, highly accurate writing can be performed. Furthermore, since the data amount can be less than that of the comparative example, it is possible to aim at high speed data transmission.

Figure 8A:
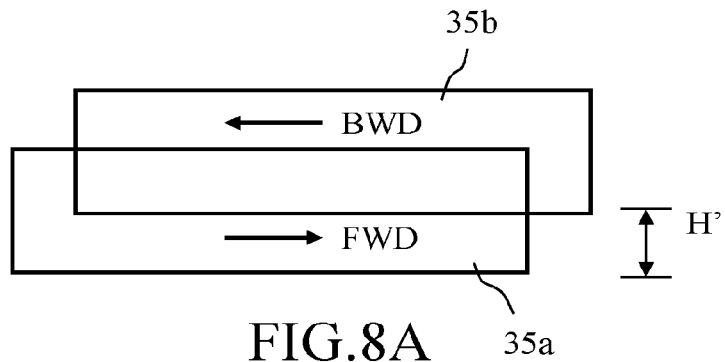
FIGS. 8A to 8C illustrate applications of writing processing according to the first embodiment.
Figure 8B:
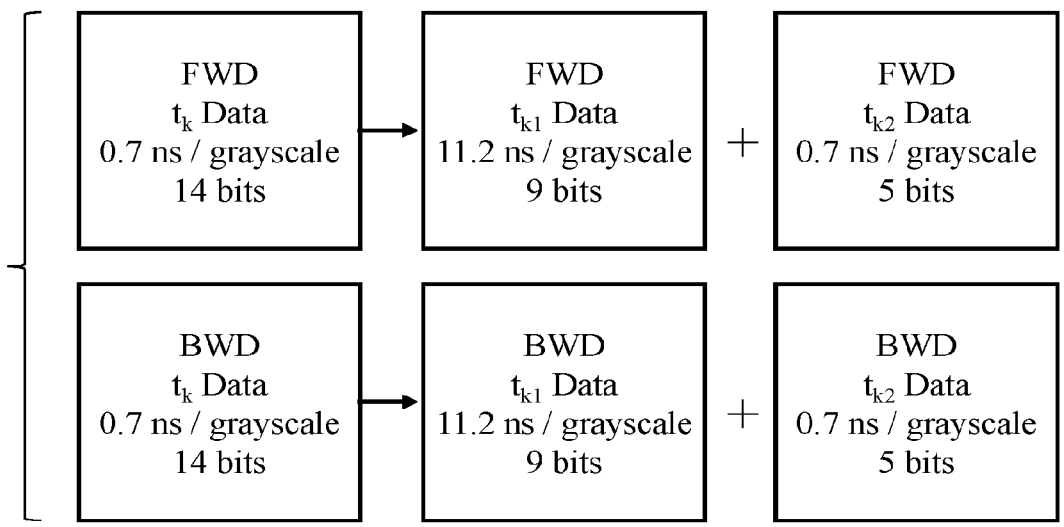
Figure 8C:
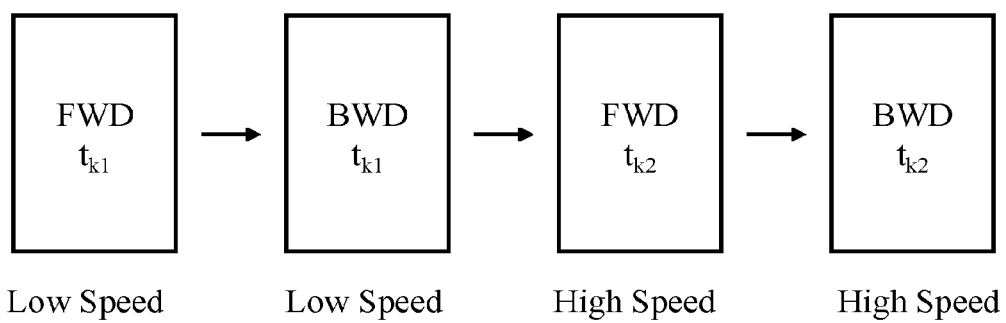

FIGS. 8A to 8C illustrate applications of writing processing according to the first embodiment. In the application as shown in FIG. 8A, the forward (FWD) writing where writing processing proceeds in +x direction and the backward (BWD) writing where writing processing proceeds in −x direction are performed. FIG. 8A shows the case where the position of the stripe region 35 to be written is shifted between the FWD writing and the BWD writing. Specifically, the stripe region 35a for writing in the FWD direction and the stripe region 35b for writing in the BWD direction are shifted with each other by H' in the y direction as shown in FIG. 8A. Also, it is preferable to be shifted in the x direction as well as in the y direction.

The $t_k$ data generation unit 52 (irradiation time data generation unit, as shown in FIG. 8B, generates FWD irradiation time $t_k$ data (first irradiation time data) for k passes, where their writing directions are in the same direction (FWD) with respect to a forward direction, and BWD irradiation time $t_k$ data (first irradiation time data) for k passes, where their writing directions are in the opposite direction (BWD) with respect to the forward direction.

Next, the data dividing unit 54 divides the FWD irradiation time $t_k$ data for k passes, where their writing directions are in the same direction (FWD), into k pieces of FWD irradiation time data (second irradiation time data), where each of the k pieces of data has a different number of bits and the total of the different numbers of bits is n-bits. In the example of FIG. 8B, the FWD irradiation time $t_k$ data for two passes is divided into FWD irradiation time $t_{k1}$ data of the high-order 9 bits for the first pass, and FWD irradiation time $t_{k2}$ data of the low-order 5 bits for the second pass, where the total of them is 14 bits. Similarly, the data dividing unit 54 divides the BWD irradiation time $t_k$ data for k passes, where their writing directions are in the opposite direction (BWD), into k pieces of BWD irradiation time data (second irradiation time data), where each of the k pieces of data has a different number of bits and the total of the different numbers of bits is n-bits. In the example of FIG. 8B, the BWD irradiation time $t_k$ data for two passes is divided into BWD irradiation time $t_{k1}$ data of the high-order 9 bits for the first pass, and BWD irradiation time $t_{k2}$ data of the low-order 5 bits for the second pass, where the total of them is 14 bits. In FWD writing and BWD writing, each of the irradiation time resolution is 11.2 ns/grayscale, for example, in the first pass, and each of the irradiation time resolution is 0.7 ns/grayscale, for example, in the second pass.

As shown in FIG. 8C, the writing mechanism 150 performs writing in such a manner that each of the k passes whose writing directions are in the same direction (FWD) and each of the k passes whose writing directions are in the opposite direction (BWD) are alternately performed. Specifically, after the first pass writing by FWD irradiation time $t_{k1}$ data, the stage position is moved in the y direction by H', and then, the first pass writing by BWD irradiation time $t_{k1}$ data is performed. Next, after moving the stage position in the −y direction by H', the second pass writing by FWD irradiation time $t_{k2}$ data is performed, and then, after moving the stage position in the y direction by H', the second pass writing by BWD irradiation time $t_{k2}$ data is performed. In that case, as described above, it is preferable that the stage speed at the first pass with the greater number of bits is slow, and the stage speed at the second pass with the smaller number of bits is fast. By making the stage speed at the first pass by FWD irradiation time $t_{k1}$ data slow, transmission of BWD irradiation time $t_{k1}$ data can be transmitted without difficulty during the slow stage movement. Even by making the stage speed at the second pass by FWD irradiation time $t_{k2}$ data with the smaller number of bits fast, transmission of the BWD irradiation time $t_{k1}$ data with the smaller number of bits can be transmitted without difficulty.

Figure 10:
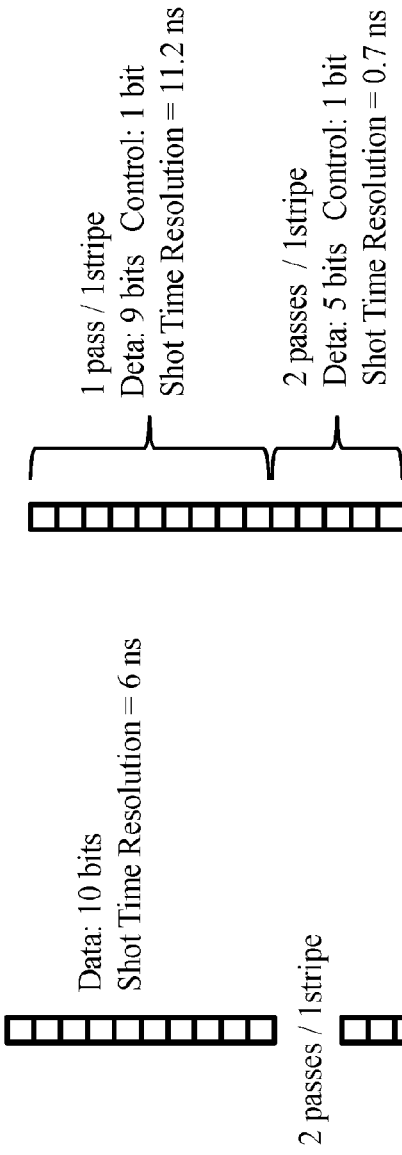
FIG. 10 shows another example for supplementing description of the first embodiment.
Figure 11:
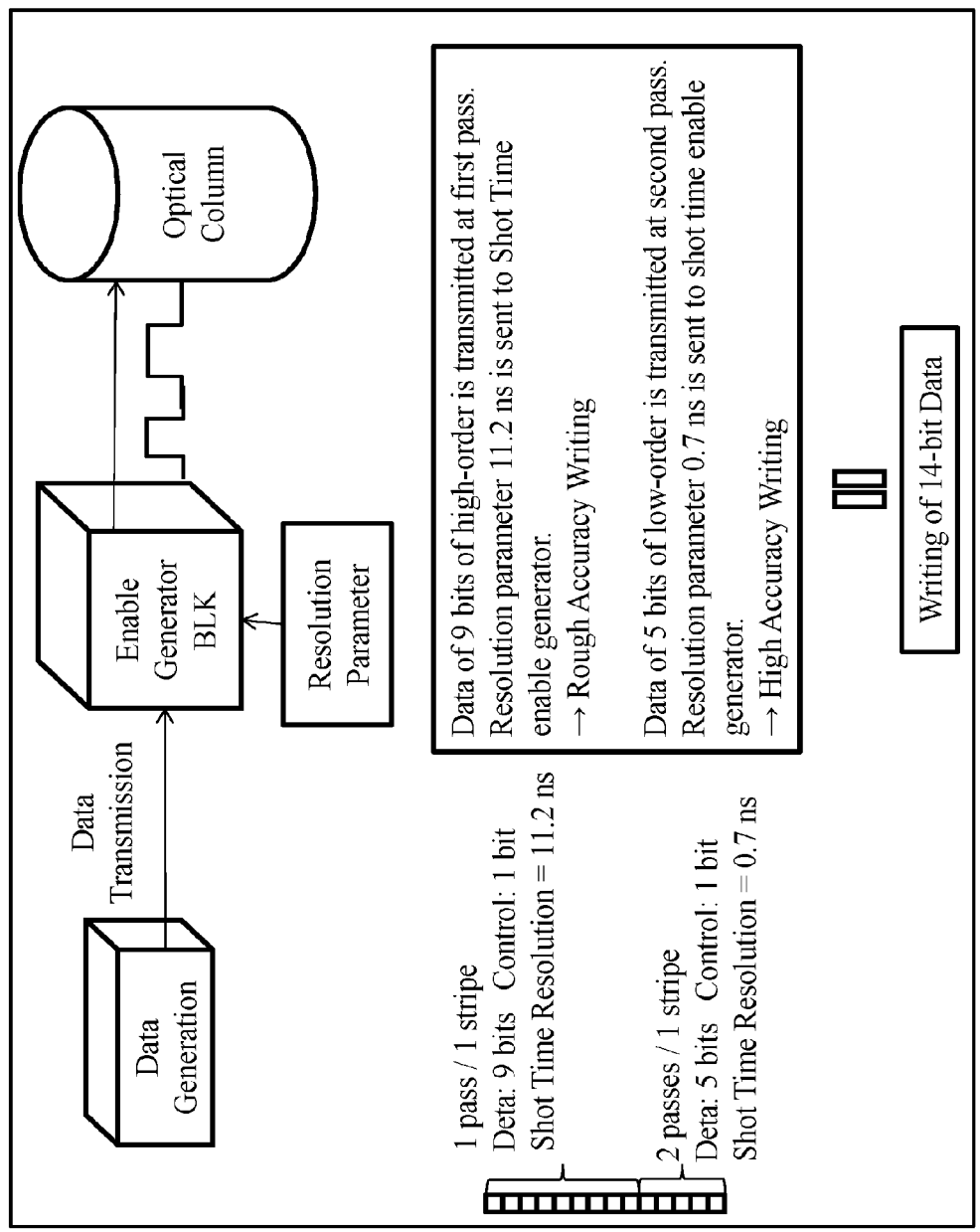
FIG. 11 shows another example for supplementing description of the first embodiment.

FIG. 9 shows an example for supplementing description of the first embodiment. FIG. 10 shows another example for supplementing description of the first embodiment. FIG. 11 shows another example for supplementing description of the first embodiment. FIGS. 9 to 11 visually supplement, for easy understanding, the above-described example of the first embodiment. As shown in FIGS. 9 to 11, by combining low performance writing of the first pass with a large resolution parameter and high performance writing of the second pass with a small resolution parameter, writing can be performed with high irradiation time resolution v as a result of the two passes. When it is possible to write with the high irradiation time resolution v, the dose error can be reduced.

As described above, according to the first embodiment, the dose error can be reduced without increasing the number of passes in multi-pass writing. Thus, highly accurate writing can be performed.

Embodiments have been explained referring to specific examples described above. However, the present invention is not limited to these specific examples. The method of variably controlling the irradiation time resolution can be applied not only to the stripe region but also to other region. For example, it is also preferable to variably set irradiation time resolution of the first pass and the second pass per block region obtained by dividing a stripe region.

While the apparatus configuration, control method, and the like not directly necessary for explaining the present invention are not described, some or all of them can be selectively used case-by-case basis. For example, although description of the configuration of the control unit for controlling the writing apparatus 100 is omitted, it should be understood that some or all of the configuration of the control unit can be selected and used appropriately when necessary.

In addition, any other multi charged particle beam writing apparatus and multi charged particle beam writing method that include elements of the present invention and that can be appropriately modified by those skilled in the art are included within the scope of the present invention.

Additional advantages and modification will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi charged particle beam writing apparatus comprising:
    a dividing processing circuitry configured to input, for each beam irradiation position, first irradiation time data for k passes defined by n (n is an integer greater than or equal to 2) bits, and divide the first irradiation time data for the k passes into k pieces of second irradiation time data, where each of the k pieces of the second irradiation time data has a different number of bits from each other which has been preset and a total of different numbers of bits is n-bits, in multi-pass writing of k (k is an integer greater than or equal to 2) passes or greater than the k passes by using multi charged particle beams;
    a storage device configured to store k pieces of resolution information each defined based on a corresponding number of bits used in the k pieces of the second irradiation time data;
    a data transmission processing circuitry configured to transmit, for each pass of the k passes, corresponding second irradiation time data in the k pieces of the second irradiation time data, for a beam concerned in the multi charged particle beams;
    a resolution information transmission processing circuitry configured to transmit, for the each pass of the k passes, corresponding resolution information in the k pieces of the resolution information;
    an irradiation time calculation processing circuitry configured to input, for the each pass of the k passes, transmitted second irradiation time data and resolution information, and calculate an irradiation time of a corresponding beam in the multi charged particle beams of a pass concerned by using input second irradiation time data and resolution information; and
    a writing mechanism configured to write, for the each pass of the k passes, a pattern on a target object by using the multi charged particle beams including the corresponding beam of a calculated irradiation time.

2. The apparatus according to claim 1, wherein
    an irradiation time making resolution stay within a desired tolerance value is defined in second irradiation time data whose number of bits to be used is smaller in the k pieces of the second irradiation time data, and
    a remaining irradiation time is defined in second irradiation time data whose number of bits to be used is greater in the k pieces of the second irradiation time data.

3. The apparatus according to claim 1, wherein
    the writing mechanism includes a movable stage to mount the target object thereon, and writes the target object while moving the stage, and
    controlling is performed with respect to the k pieces of the second irradiation time data such that a moving speed of the stage at a pass using the second irradiation time data with greater number of bits is slower than a moving speed of the stage at a pass using the second irradiation time data with smaller number of bits.

4. The apparatus according to claim 1 further comprising:
    an irradiation time data generation processing circuitry configured to generate the first irradiation time data for the k passes, where their writing directions are in a same direction, and the first irradiation time data for the k passes, where their writing directions are in an opposite direction, wherein the dividing processing circuitry divides the first irradiation time data for the k passes, where their writing directions are in the same direction, into the k pieces of second irradiation time data, where each of the k pieces of the second irradiation time data has a different number of bits and a total of different numbers of bits is n-bits, and divides the first irradiation time data for the k passes, where their writing directions are in the opposite direction, into the k pieces of second irradiation time data, where each of the k pieces of the second irradiation time data has a different number of bits and a total of different numbers of bits is n-bits, and the writing mechanism performs writing in such a manner that each of the k passes, where their writing directions are in the same direction, and each of the k passes, where their writing directions are in the opposite direction, are alternately performed.

5. The apparatus according to claim 1 further comprising:
a total irradiation time calculation processing circuitry configured to calculate, for each beam irradiation position on the target object, a total irradiation time for all passes of multi-pass writing to irradiate an irradiation position of a beam concerned, in the multi-pass writing of the passes greater than the k (k is an integer greater than or equal to 2) passes by using the multi charged particle beams; and
an irradiation time data generation processing circuitry configured to generate, for the each beam irradiation position, the first irradiation time data for the k passes defined by the n bits, by using the total irradiation time, in the multi-pass writing of the passes greater than the k (k is an integer greater than or equal to 2) passes by using the multi charged particle beams.

6. A multi charged particle beam writing method comprising:
inputting, for each beam irradiation position, first irradiation time data for k passes defined by n (n is an integer greater than or equal to 2) bits, and dividing the first irradiation time data for the k passes into k pieces of second irradiation time data, where each of the k pieces of the second irradiation time data has a different number of bits from each other which has been preset and a total of different numbers of bits is n-bits, in multi-pass writing of k (k is an integer greater than or equal to 2) passes or greater than the k passes by using multi charged particle beams;
transmitting, for each pass of the k passes, corresponding second irradiation time data in the k pieces of the second irradiation time data, for a beam concerned in the multi charged particle beams;
transmitting, for the each pass of the k passes, corresponding resolution information in k pieces of resolution information each defined based on a corresponding number of bits used in the k pieces of the second irradiation time data stored in a storage device;
inputting, for the each pass of the k passes, transmitted second irradiation time data and resolution information, and calculating an irradiation time of a corresponding beam in the multi charged particle beams of a pass concerned by using input second irradiation time data and resolution information; and
writing, for the each pass of the k passes, a pattern on a target object by using the multi charged particle beams including the corresponding beam of a calculated irradiation time.

7. The method according to claim 6, wherein
an irradiation time making resolution stay within a desired tolerance value is defined in second irradiation time data whose number of bits to be used is smaller in the k pieces of the second irradiation time data, and
a remaining irradiation time is defined in second irradiation time data whose number of bits to be used is greater in the k pieces of the second irradiation time data.

8. The method according to claim 6, wherein
the writing is performed on the target object placed on a stage while moving the stage, and
controlling is performed with respect to the k pieces of the second irradiation time data such that a moving speed of the stage at a pass using the second irradiation time data with greater number of bits is slower than a moving speed of the stage at a pass using the second irradiation time data with smaller number of bits.

9. The method according to claim 6 further comprising:
calculating, for each beam irradiation position on the target object, a total irradiation time for all passes of multi-pass writing to irradiate an irradiation position of a beam concerned, in the multi-pass writing of the passes greater than the k (k is an integer greater than or equal to 2) passes by using the multi charged particle beams; and
generating, for the each beam irradiation position, the first irradiation time data for the k passes defined by the n bits, by using the total irradiation time, in the multi-pass writing of the passes greater than the k (k is an integer greater than or equal to 2) passes by using the multi charged particle beams.

10. The method according to claim 9, wherein
the first irradiation time data is calculated, for the each beam irradiation position, as a value obtained by dividing the total irradiation time by a value of 1/k of a number of passes, N, in multi-pass writing of the N passes.

* * * * *